United States Patent [19]
Baliga

[11] Patent Number: 5,396,085
[45] Date of Patent: Mar. 7, 1995

[54] SILICON CARBIDE SWITCHING DEVICE WITH RECTIFYING-GATE

[75] Inventor: Bantval J. Baliga, Raleigh, N.C.

[73] Assignee: North Carolina State University, Raleigh, N.C.

[21] Appl. No.: 174,690

[22] Filed: Dec. 28, 1993

[51] Int. Cl.[6] .............. H01L 29/10; H01L 29/78; H01L 29/161; H01L 29/20

[52] U.S. Cl. .................. 257/77; 257/260; 257/261; 257/267

[58] Field of Search ......... 257/77, 260, 261, 262, 257/263, 133, 134, 135, 136, 365, 267, 264

[56] References Cited

U.S. PATENT DOCUMENTS

| | | | |
|---|---|---|---|
| 4,571,815 | 2/1986 | Baliga et al. | 29/571 |
| 4,587,712 | 5/1986 | Baliga | 29/571 |
| 4,827,321 | 5/1989 | Baliga | 357/37 |
| 4,835,586 | 5/1989 | Cogan et al. | 257/260 |
| 4,903,189 | 2/1990 | Ngo et al. | 363/127 |
| 4,961,100 | 10/1990 | Baliga et al. | 357/39 |
| 5,202,750 | 4/1993 | Gough | 257/133 |
| 5,233,215 | 8/1993 | Baliga | 257/490 |
| 5,313,082 | 5/1994 | Ecklund | 257/262 |

OTHER PUBLICATIONS

Galina Kelner, et al., *β-SiC MESFET's and Buried--Gate JFET's*, IEEE Electron Device Letters, vol. EDL-8, No. 9, pp. 428–430, Sep. 1987.

Kreishna Shenai, *Optimized Trench MOSFET Technologies for Power Devices*, IEEE Transactions on Electron Devices, vol. 39, No. 6, pp. 1435–1443, Jun. 1992.

Robert J. Trew, et al., *The Potential of Diamond and SiC Electronic Devices for Microwave and Millimeter-Wave Power Applications*, Proceedings of the IEEE, vol. 79, No. 5, pp. 598–620, May 1991.

Krishna Shenai, et al., *Optimum Semiconductors for High-Power Electronics*, IEEE Transactions on Electron Devices, vol. 36, No. 9, pp. 1811–1823, Sep. 1989.

H. Daimon, et al., *Operation of Schottky-barrier field-effect transistors of 3C-SiC up to 400° C.*, Appl. Phys. Lett., vol. 51, No. 25, pp. 2106–2108, Dec. 1987.

John W. Bumgarner, et al., *Monocrystalline β-SiC Semiconductor Thin Films: Epitaxial Growth, Doping, and FET Device Development*, Proceedings of 38th Electronic Components Conference, pp. 342–349, 1988.

B. Jayant Baliga, *An Overview of Smart Power Technology*, IEEE Transactions on Electron Devices, vol. 38, No. 7, pp. 1568–1575, Jul. 1991.

H.-R. Chang and B. Jayant Baliga, *500-V n-Channel Insulated-Gate Bipolar Transistor with a Trench Gate Structure*, IEEE Transactions on Electron Devices, vol. 36, No. 9, pp. 1824–1829, Sep. 1989.

S. Colak, et al., *Lateral DMOS Power Transistor Design*, IEEE Electron Device Letters, vol. EDL-1, No. 4, pp. 51–53, Apr. 1980.

G. Kelner, et al., *β-SiC MESFETs*, Mat. Res. Soc. Symp. Proc., vol. 97, pp. 227–232, 1987.

*Primary Examiner*—Andrew J. James
*Assistant Examiner*—Donald L. Monin, Jr.
*Attorney, Agent, or Firm*—Bell, Seltzer, Park & Gibson

[57] ABSTRACT

A silicon carbide switching device includes a three-terminal interconnected silicon MOSFET and silicon carbide MESFET (or JFET) in a composite substrate of silicon and silicon carbide. For three terminal operation, the gate electrode of the silicon carbide MESFET is electrically shorted to the source region of the silicon MOSFET, and the source region of the silicon carbide MESFET is electrically connected to the drain of the silicon MOSFET in the composite substrate. Accordingly, three-terminal control is provided by the source and gate electrode of the silicon MOSFET and the drain of the silicon carbide MESFET (or JFET). The switching device is designed to be normally-off and therefore blocks positive drain biases when the MOSFET gate electrode is shorted to the source electrode. At low drain biases, blocking is provided by the MOSFET, which has a nonconductive silicon active region. Higher drain biases are supported by the formation of a depletion region in the silicon carbide MESFET (or JFET). To turn-on the device, the gate electrode is biased positive and an inversion layer channel of relatively low resistance is formed in the silicon active region. The channel electrically connects the source of the silicon carbide MESFET (or JFET) with the source of the silicon MOSFET to thereby turn-on the device when a positive drain bias is applied.

28 Claims, 6 Drawing Sheets

SILICON CARBIDE SWITCHING DEVICE WITH RECTIFYING-GATE

FIELD OF THE INVENTION

The present invention relates to semiconductor switching devices and more particularly to silicon carbide switching devices.

BACKGROUND OF THE INVENTION

The silicon bipolar transistor has been the device of choice for motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate is used to provide turn-on and turn-off control upon the application of an appropriate gate signal bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween. The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

In view of the above desirable characteristics, many variations of power MOSFETs have been designed for high power applications. Two of the most popular types are the double-diffused MOSFET (DMOS) device and the trench-gate MOSFET (UMOS). Both of these devices are vertical devices, having a source region located on one face of a semiconductor substrate and a drain region located on an opposite face.

The DMOS structure and its operation and fabrication are described in the textbook entitled *Modern Power Devices* by inventor B.J. Baliga, the disclosure of which is hereby incorporated herein by reference. Chapter 6 of this textbook describes power MOSFETs at pages 263–343. FIG. 1 herein is a reproduction of FIG. 6.1(a) from the above cited textbook, and illustrates a cross-sectional view of a basic DMOS structure. As shown, the DMOS structure is fabricated using planar diffusion technology, with a refractory gate such as polycrystalline silicon (polysilicon). The P-base region and the N+ source region are typically diffused through a common window defined by the edge of the polysilicon gate. The P-base region is typically driven in deeper than the N+ source. The difference in the lateral diffusion between the P-base and N+ source regions defines the channel length. The length of the channel is an important design parameter because it has a strong influence on the DMOSFET's on-resistance and transconductance.

Turn-on of a power DMOS is controlled by the insulated-gate electrode. Referring to FIG. 1, a highly conductive inversion layer channel can be generated in the P-base region upon the application of a positive gate bias. This inversion layer channel electrically connects the source region to the drift region, thereby allowing conduction between the source and drain upon the application of an appropriate drain bias. To switch the power DMOS to the off-state, the gate bias voltage is reduced to zero by externally short circuiting the gate electrode to the source electrode. In order to insure that the parasitic bipolar transistor formed by the N+ source, P-base and N-drift region is kept inactive during operation of the power DMOS, the P-base region is short circuited to the N+ source, as shown in FIG. 1.

The UMOS device, also referred to as a "Trench DMOS" device, is described in publications entitled *An Ultra-Low On-Resistance Power MOSFET Fabricated by Using a Fully Self-Aligned Process,* by Ueda et al., IEEE Transactions on Electron Devices, Vol. ED34, No. 4, April, (1987), pp. 926–930; *Numerical and Experimental Comparison of 60 V Vertical Double-Diffused MOSFETS and MOSFETS with a Trench-Gate Structure* by Chang, Solid State Electronics, Vol. 32, No. 3, pp. 247–251, (1989); *Trench DMOS Transistor Technology for High-Current (100A Range) Switching* by Buluce et al., Solid State Electronics, Vol. 34, No. 5, pp. 493–507, (1991); *Extended Trench-Gate Power UMOSFET Structure with Ultralow Specific On-Resistance* by Syau et al., Electronics Letters, Vol. 28, No. 9, pp. 865–867, (1992); and *Optimized Trench MOSFET Technologies for Power De-* vices by Shenai, IEEE Transactions on Electron Devices, Vol. 39, No. 6, pp. 1435-1443, June (1992). As described in the aforementioned article by Ueda, the UMOS contains a rectangular trench which makes each unit cell relatively small and provides for high levels of integration. FIG. 2 herein is a reproduction of a portion of FIG. 1 from the Ueda article. The device is fabricated by diffusing P-base and N+ source regions into an N− epitaxial drift region of an N+ substrate. Reactive ion etching is then used to form rectangular grooves or trenches in the substrate, followed by an oxidation step to form the gate insulating layer. A first polysilicon layer is also grown and slightly oxidized and a second polysilicon layer is deposited for groove filling. In order to form the gate, the first polysilicon layer is etched off and then the device is metallized.

However, for high power applications, the performance of both the vertical DMOS and UMOS structures is limited by the presence of a P-N junction between the source and drain, which can slow the response time when switching from a high forward current on-state to the off-state. A silicon power MOSFET which does not suffer from the presence of a P-N junction is shown in FIG. 3. FIG. 3 is a reproduction of FIG. 4 from U.S Pat. No. 4,903,189 to Ngo et al., entitled *Low Noise, High Frequency Synchronous Rectifier,* the disclosure of which is hereby incorporated herein by reference. This MOSFET 170, which includes trenches 178 at a face thereof is commonly referred to as an accumulation-mode FET ("ACCU-FET") because turn-on is achieved by forming a conductive accumulation layer between the FET's source 186 and drain 182 regions.

In addition to the above-mentioned silicon-based power transistors, attempts have been made to develop power transistors based in silicon carbide because of silicon carbide's wide bandgap, high melting point, low dielectric constant, high breakdown field strength, high thermal conductivity and high saturated electron drift velocity compared to silicon. These characteristics allow silicon carbide power devices to operate at higher temperatures, higher power levels and with lower specific on-resistance than conventional silicon based power devices. One attempt to take advantage of silicon carbide's preferred characteristics is disclosed in commonly assigned U.S. Pat. No. 5,233,215 to inventor B.J. Baliga, entitled *Silicon Carbide Power MOSFET with Floating Field Ring and Floating Field Plate,* the disclosure of which is hereby incorporated herein by reference. FIG. 4 is a reproduction of FIG. 4 from the Baliga '215 patent. Unfortunately, operation of this device requires the formation of an N-type silicon carbide inversion layer channel in region 18, which may causes a relatively high channel resistance and high on-state resistance. It may also be difficult to form good quality oxides on P-type silicon carbide using conventional oxidation techniques.

Another attempt to develop silicon carbide devices for high power applications is disclosed in an article by Kelner et al. entitled *β-SiC MESFET's and Buried-Gate JFET's,* IEEE Electron Device Letters, Vol. EDL-8, No. 9, pp. 428-430, September (1987). Kelner et al. discloses a lateral silicon carbide MESFET having an N-type active region on top of a P-type layer and a schottky barrier gate. Kelner et al. also discloses a JFET having a buried-gate electrode formed of the P-type layer. Unfortunately, the Kelner et al. FETs suffer from an unnecessarily high output conductance, caused by leakage current in the P-type layer. Furthermore, complete channel pinch-off between the source and drain regions could not be attained.

Therefore, notwithstanding the recognized benefits of using power FETs for applications requiring high-speed turn-off and low gate-drive currents, there continues to be a need for power devices which are capable of sustaining high currents at high temperatures with relatively low on-state resistance. There also continues to be a need for power devices which are capable of blocking relatively large drain to source voltages and which do not suffer from large leakage currents.

SUMMARY OF THE INVENTION

It is therefore an object of the present invention to provide a semiconductor switching device capable of sustaining high on-state current densities for high power applications.

It is another object of the present invention to provide a semiconductor switching device having high blocking voltage capability and low on-state resistance.

These and other objects are provided, according to the present invention, by a three terminal gate-controlled switching device formed by two interconnected field effect transistors. The interconnected transistors are an insulated-gate field effect transistor and a rectifying-gate field effect transistor in a semiconductor substrate. The gate and source of the rectifying-gate field effect transistor are electrically connected to the source and drain of the insulated-gate field effect transistor, respectively. Moreover, the source and gate of the insulated-gate field effect transistor and the drain of the rectifying-gate field effect transistor form the source, gate and drain of the three terminal switching device. The rectifying-gate field effect transistor can comprise either a silicon carbide JFET or a silicon carbide MESFET and the insulated-gate field effect transistor preferably comprises an N-channel enhancement-mode silicon MOSFET. Accordingly, a preferred embodiment of the present invention includes interconnected silicon and silicon carbide field effect transistors in a semiconductor substrate which collectively form a three terminal switching device suitable for high power applications.

In particular, a switching device of the present invention preferably comprises a semiconductor substrate having first and second opposing faces and source and drain contacts thereon, respectively. A silicon carbide field effect transistor is provided in the substrate and includes a gate, electrically connected to the source contact at the first face, and a drain region, electrically connected to the drain contact at the second face. A silicon insulated-gate field effect transistor is also provided in the substrate, and it has an active region which extends between the source region of the silicon carbide field effect transistor and the source contact. The source region of the silicon insulated-gate field effect transistor ohmically contacts the source contact on the first face, whereas its drain region is electrically connected to the source region of the silicon carbide field effect transistor.

Accordingly, application of a turn-on bias signal to the gate electrode of the insulated-gate field effect transistor causes an electrical connection to be formed between the source region of the silicon carbide field effect transistor and the source contact on the first face. Application of a turn-on bias signal allows for majority carrier conduction from the source contact to the drain contact when the drain contact is biased to a first polarity relative to the source contact. Moreover, because the gate of the silicon carbide field effect transistor is electrically connected to the source contact, a flyback diode is produced which becomes conductive when the source contact is biased to a first polarity relative to the drain contact. If the silicon carbide field effect transistor is a MESFET, the flyback diode will comprise a Schottky barrier rectifier for providing majority carrier conduction from the drain contact to the source contact.

The switching device of the present invention can also comprise a semiconductor substrate a drift region of first conductivity type (e.g., N-type) in the substrate. A source region of first conductivity type is also provided in the semiconductor substrate, and extends to a face thereof. The embodiment further includes insulated-gate transistor means having an active region of second conductivity type (e.g., P-type) in the substrate. Insulated-gate transistor means electrically connects the source region at the first face to the drift region in response to a turn-on bias signal. Rectifying-gate transistor means is also provided in the substrate for controlling the conductivity of the drift region in response to the application of a potential bias across the source region and drift region. For three terminal device operation, the gate electrode of the rectifying-gate transistor means is electrically connected to the source region at the face.

A trench may also be provided in the substrate at the face for facilitating the placement of the insulated-gate transistor means. The trench preferably has a sidewall extending between the source region at the face and the drift region so that the gate electrode of the insulated-gate transistor means can be formed on the trench sidewall, adjacent an active region, which extends between the source region and the drift region. The gate electrode of the rectifying-gate transistor means can also be formed on the sidewall and can also extend along the bottom of the trench. The rectifying-gate thereby forms a flyback diode with the adjacent drift region.

By interconnecting a silicon insulated-gate field effect transistor with a silicon carbide rectifying-gate field effect transistor (MESFET or JFET) as described above, the performance advantages provided by both materials can be simultaneously achieved in a single three terminal device. In particular, a low breakdown voltage silicon power MOSFET having low on-state resistance can be combined with a high breakdown voltage silicon carbide rectifying-gate field effect transistor to form a composite device having low on-state resistance and high blocking voltage capability at zero gate bias. Accordingly, unlike the aforementioned silicon carbide devices of the prior art, the three-terminal switching device of the present invention does not require the formation of an inversion layer in silicon carbide, but complete pinch-off between the silicon source region and silicon carbide drain region at zero gate bias can be achieved. Moreover, the present invention does not require the formation of an oxide on silicon carbide, which is difficult to achieve.

DESCRIPTION OF PREFERRED EMBODIMENTS

Figure 1:
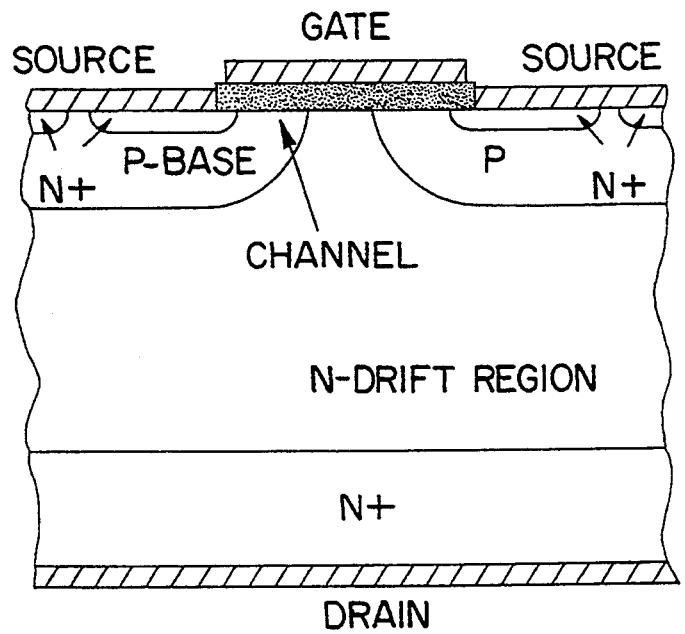
FIG. 1 illustrates a cross-sectional representation of a prior art silicon power DMOSFET.
Figure 2:
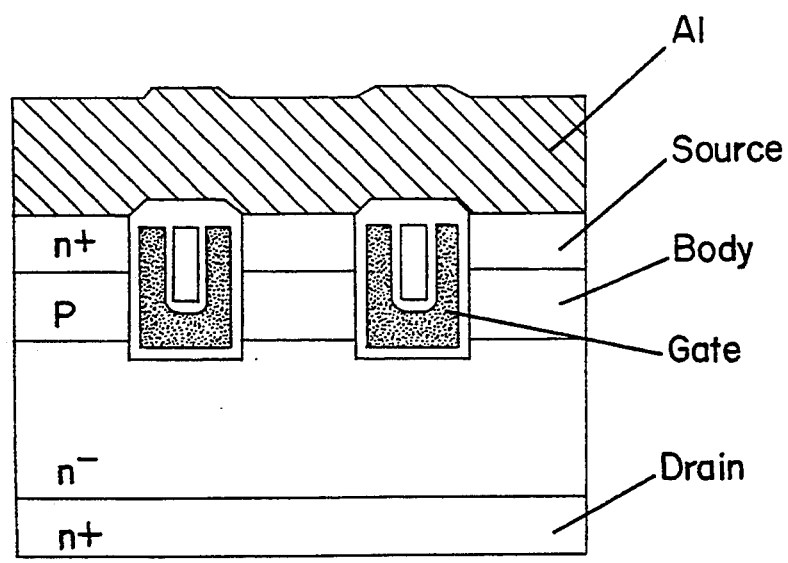
FIG. 2 illustrates a cross-sectional representation of a prior art silicon power UMOSFET.
Figure 3:
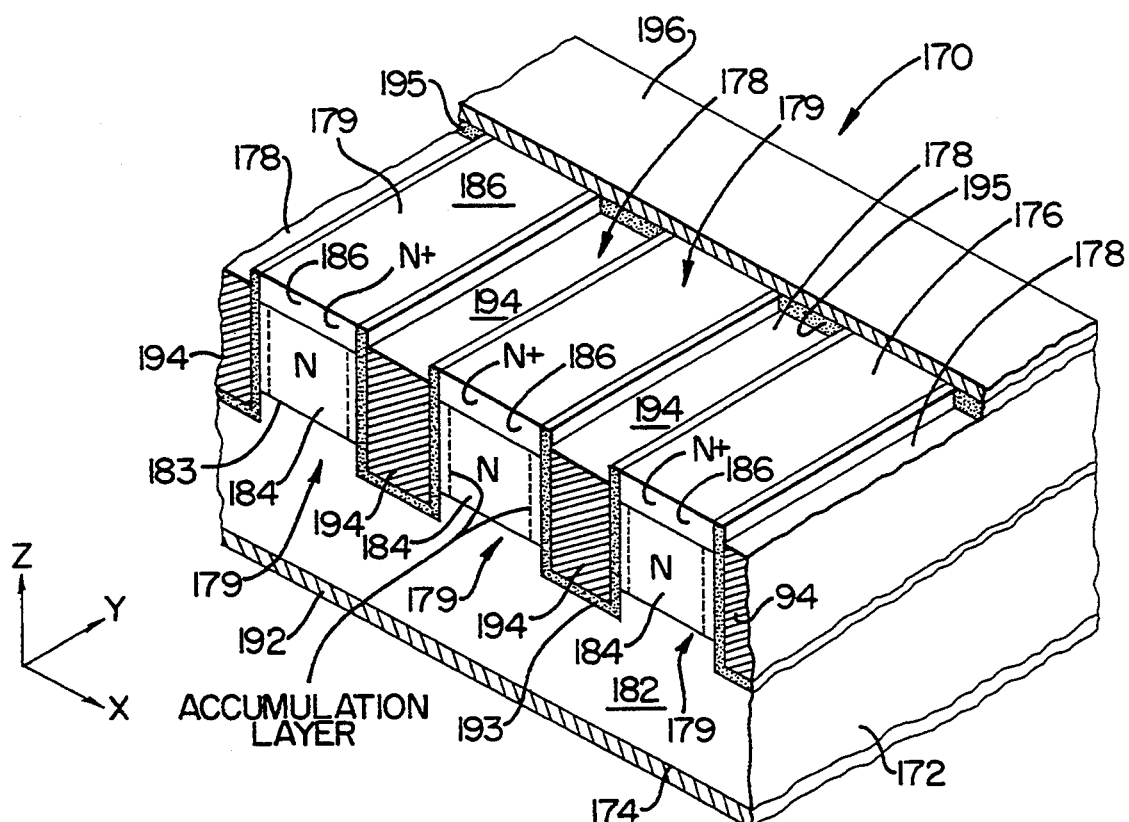
FIG. 3 illustrates a cross-sectional representation of a prior art silicon ACCUFET.
Figure 4:
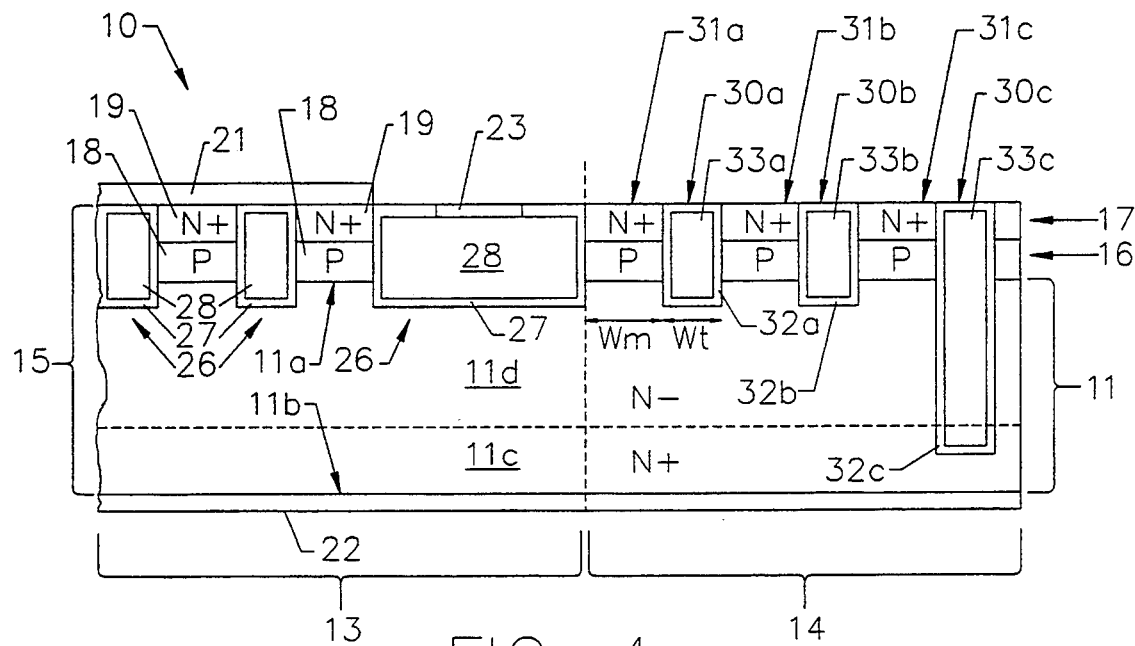
FIG. 4 illustrates a cross-sectional representation of a prior art silicon carbide power MOSFET.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5A:
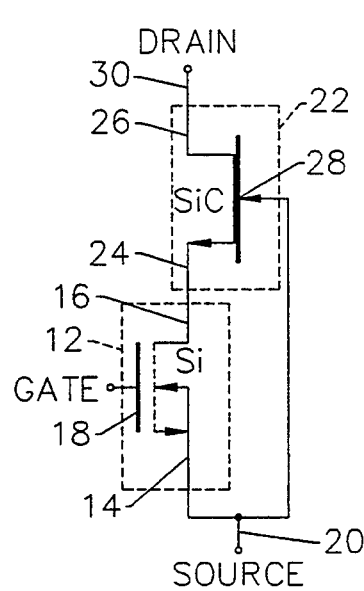
FIG. 5A schematically illustrates a silicon carbide switching device with rectifying-gate, according to a preferred embodiment of the present invention.

Referring now to FIG. 5A, an electrical schematic illustrating a three-terminal silicon carbide switching device with rectifying-gate 10, according to a preferred embodiment of the present invention, will be described. In particular, the three-terminal switching device 10 comprises an insulated-gate field effect transistor 12 (shown as a Si MOSFET) having a first source region 14, a first drain region 16 and an insulated-gate electrode 18. As will be understood by those skilled in the art, the insulated gate field effect transistor 12 is preferably an enhancement-mode device which is nonconductive at zero potential gate bias (shown by dotted lines). Accordingly, conduction in the transistor 12 typically requires the formation of an inversion layer channel in the transistor's active region. Alternatively, as described with respect to FIGS. 8 and 9 described hereinbelow, the transistor 12 may also be an ACCU-FET, which is preferably designed to be nonconductive at zero potential gate bias.

A rectifying-gate field effect transistor 22 (shown as a SiC MESFET), having a second source region 24, a second drain region 26 and a rectifying-gate electrode 28 is also provided, connected to the insulated-gate field effect transistor 12, as shown. Source and drain contacts 20 and 30, respectively, are also provided. Accordingly, electrical connection to the three terminal device is provided by the insulated-gate electrode 18, the source contact 20 and the drain contact 30.

Figure 5B:
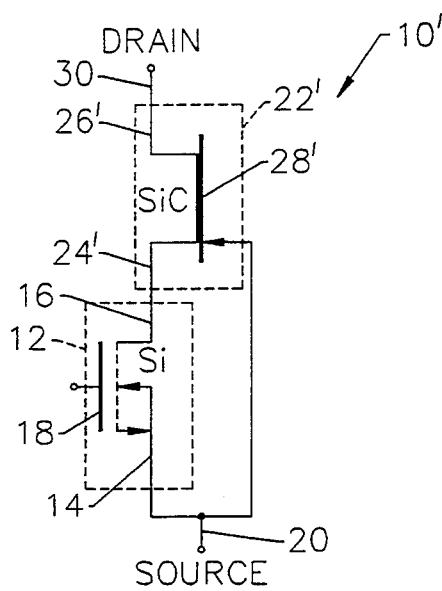
FIG. 5B schematically illustrates a silicon carbide switching device with rectifying-gate, according to a second embodiment of the present invention.

Referring now to FIG. 5B, an electrical schematic illustrating a three-terminal silicon carbide switching device with rectifying-gate 10', according to a second embodiment of the present invention, will be described. In particular, the three-terminal switching device 10' comprises a rectifying-gate field effect transistor 22' (shown as a SiC JFET), having a second source region 24', a second drain region 26' and a rectifying-gate electrode 28', connected to the insulated-gate field effect transistor 12, as shown.

Figure 6:
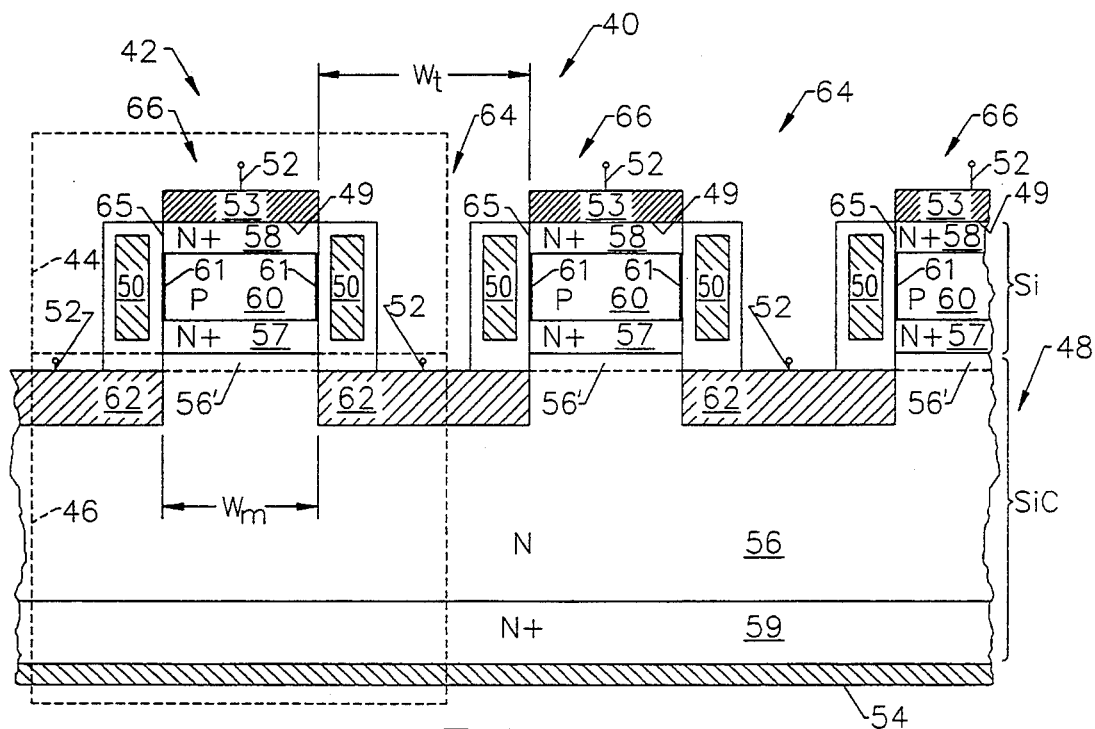
FIG. 6 illustrates a cross-sectional representation of a silicon carbide switching device in a semiconductor substrate, according to a preferred embodiment of FIG. 5A.

To facilitate the formation of a preferred switching device 10 of FIG. 5A, a composite semiconductor substrate 48 having regions of both SiC and Si may be used. In particular, FIG. 6 is a cross-sectional representation of an embodiment of the switching device of FIG. 5A, in the composite substrate 48, having a face 49 thereon. The switching device 40 is formed by a plurality of parallel-connected switching cells 42, each of which includes insulated-gate transistor means 44 and rectifying-gate transistor means 46. Control of the device 40 is provided by three terminals, including an insulated-gate electrode 50, a source electrode 52 on the first face 49 and a drain electrode and contact 54 on an opposing second face.

The switching cell 42 further includes a silicon carbide drift region 56 of first conductivity type and a silicon source region 58 of first conductivity type at opposing faces, in the semiconductor substrate 48. Insulated-gate transistor means 44 preferably includes a silicon active region of second conductivity type beneath the source region 58 and a silicon drain region 57 of first conductivity type beneath the active region 60. In response to an appropriate turn-on bias signal to the insulated-gate electrode 50, the silicon source region 58 and silicon carbide drift region 56 become electrically connected. As will be understood by those skilled in the art, the application of a positive gate bias signal to the insulated gate electrode 50 will cause the formation of a conductive inversion layer channel 61 (N-type) in the active region (shown as P-type), between the N+ source region 58 and the N+ drain region 57. Drain region 57 ohmically contacts the silicon carbide drift region 56. Although not shown in FIGS. 6 and 7, the active region 60 is held at the potential of the silicon source region 58 by an appropriate connection.

Rectifying-gate transistor means 46 includes a rectifying-gate 62, adjacent the drift region 56. The rectifying-gate 62 is electrically connected to the source electrode 52 and the source contact 53, which ohmically contacts the source region 58 at the first face 49. The rectifying-gate 62 preferably forms a Schottky barrier rectifier with the adjacent drift region 56.

A plurality of trenches 64 having width "$W_t$," are also formed in the composite substrate 48 to facilitate the interconnection of insulated-gate transistor means 44 with the rectifying gate transistor means 46. Each of the trenches preferably comprises a sidewall 65 extending between the source region 58 and the drift region 56 and a trench bottom, adjacent the drift region 56. Accordingly, insulated-gate transistor means 44 may include an insulated-gate electrode 50 which extends adjacent the sidewall 65 and rectifying-gate transistor means 46 may include a rectifying-gate 62, which extends adjacent the sidewall 65, between the insulated-gate electrode 50 and the trench bottom. Preferably, the trenches 64 are formed as a plurality of parallel stripes in the substrate 48, although other configurations may be used. Each pair of adjacent trenches defines a mesa 66, wherein insulated-gate transistor means 44 is formed.

As shown, insulated-gate transistor means 44 preferably comprises an N-Channel enhancement-mode silicon MOSFET having N+ source and drain regions 58 and 57, respectively, and a P-type active region 60 therebetween. Rectifying-gate transistor means 46 also comprises a silicon carbide MESFET having a drift region 56, a drain region 59 at the second face and a source region 56' (shown by dotted lines), adjacent the silicon drain region 57. The source region 56' may be an extension of the drift region 56 (as shown) or it may be a more highly doped region of first conductivity type.

As will be understood by those skilled in the art, the composite switching device 40 will have normally-off behavior, high blocking voltage capability and low on-state resistance. For example, if the insulated-gate electrode 50 is held at zero potential bias by being shorted to the source electrode 52, the switching device 40 will block current flow even when the drain electrode 54 is biased positive with respect to the source electrode 52. In particular, at relatively small positive drain biases, the voltage will be supported by the normally-off silicon MOSFET. However, at larger positive drain biases, the silicon carbide MESFET (which includes the reversed-biased Schottky barrier rectifier formed by regions 62 and 56) will pinch-off (i.e., fully deplete) that portion of the drift region 56 which extends between adjacent rectifying gates 62 (i.e., the channel). Finally, additional increases in drain bias will be supported by the extension of the depletion region towards the drain region 59. Accordingly, the silicon MOSFET need not be designed to block large voltages by itself. Instead, if the doping of the silicon carbide drift region 56 and width ("$W_m$") of the mesas 66 are chosen to obtain a pinch-off voltage of less than about 30 volts, a high voltage composite structure can be achieved with (i) a low breakdown voltage (e.g., 50 volt) silicon power MOSFET having an inversion layer channel 61 of low resistance and (ii) a high breakdown voltage (e.g., 1000 volt) silicon carbide MESFET.

Turn-on of the composite switching device 40 can be achieved by applying a positive gate bias to the insulated-gate electrode 50 to form the channel 61 and a positive bias to the drain electrode 54. For a 50 volt silicon MOSFET, its on-state voltage drop across the active region 60 will be about 0.1 volts, thereby maintaining the silicon carbide source region 56' at a potential approximately equal to the source electrode 52. Thus, the silicon carbide MESFET will not come close to pinching-off the channel, because the reverse bias across the Schottky rectifier (regions 56/62) will be small.

Two-dimensional simulations of the switching device 40 of FIG. 6 reveal a on-state voltage drop of 0.2 volts for a composite device having a 50 volt silicon power MOSFET and a 1000 volt silicon carbide MESFET, having the parameters set forth in Table 1.

TABLE 1

| Region | Composition | $N_D/N_a$ | Thickness/Depth | Width (unit cell) |
|---|---|---|---|---|
| 53 Source Contact | Metal | — | 1 micron | — |
| 58 Source | N+ Si | $1 \times 10^{19}$ | 1 micron | 1 micron |
| 60 Active | P Si | $1 \times 10^{17}$ | 2 microns | 1 micron |
| 57 Drain | N+ Si | $1 \times 10^{19}$ | 1 micron | 1 micron |
| 56 Drift | N SiC | $2 \times 10^{16}$ | 8 microns | 2 microns |
| 59 Drain | N+ SiC | $1 \times 10^{19}$ | 300–500 microns | 2 microns |
| 50 Gate | N Poly-Si | $1 \times 10^{19}$ | — | — |
| 62 Gate | Metal | — | — | — |
| 54 Drain Contact | Metal | — | 1 micron | — |

In addition to the above-mentioned characteristics, the composite switching device 40 can also provide a current saturation mode of operation at high voltages. In particular, when the positive bias applied to the insulated-gate electrode 50 is reduced to thereby achieve current saturation in the active region 60 of the MOSFET, the potential of the silicon drain region 57 and silicon carbide source region 56' will increase. This increase in potential will have the effect of further reverse-biasing the Schottky rectifier and pinching-off the channel between adjacent rectifying-gates 62. Accordingly, the composite switching device 40 can support high drain voltages with saturated current flow. Moreover, because current transport in the silicon MOSFET and silicon carbide MESFET occurs by majority carriers, turn-on and turn-off times are expected to be less than 100 nanoseconds.

The composite switching device 40 also includes a flyback (reverse conducting) diode formed by the rectifying-gate electrode 62 and drift region 56. Because of the relatively small drift region resistance, the flyback diode will have low on-state voltage drop of slightly greater than 1 volt, based on the parameters of Table 1.

Figure 7:
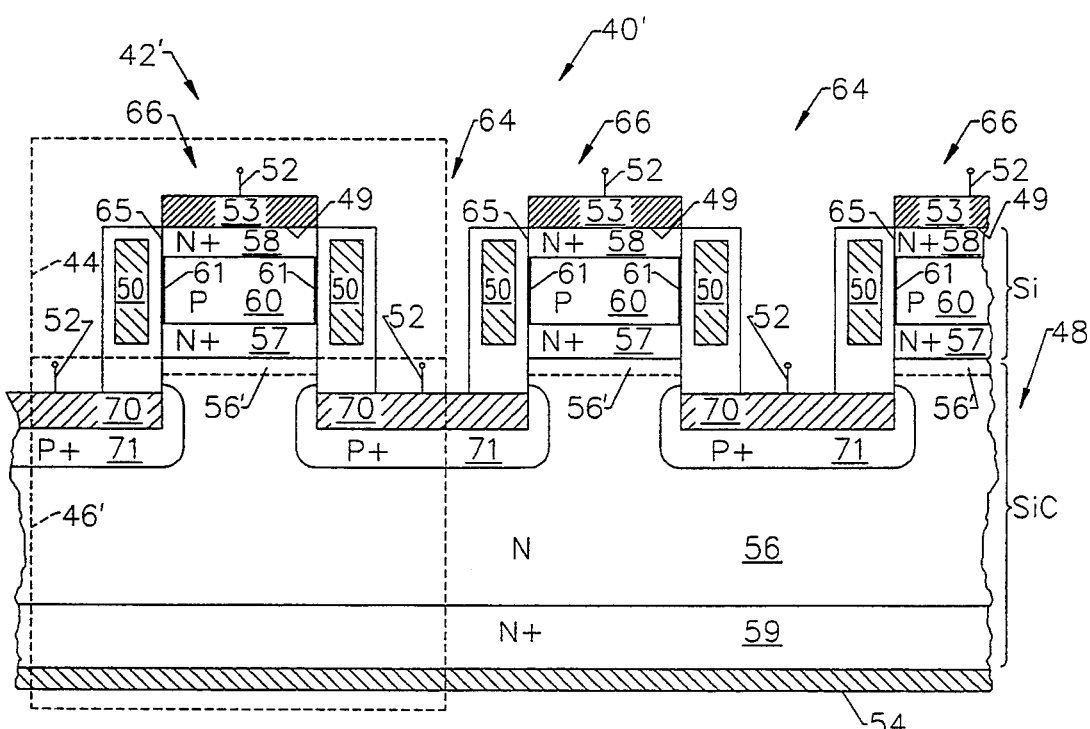
FIG. 7 illustrates a cross-sectional representation of a silicon carbide switching device in a semiconductor substrate, according to the second embodiment of FIG. 5B.

Referring now to FIG. 7, a cross-sectional representation of one embodiment of the switching device 10' of FIG. 5B will be described. In particular, the switching device 40' of FIG. 7 is similar to the switching device 40 of FIG. 6, however, the Schottky barrier rectifier formed by regions 62/56 has been replaced by a field effect transistor comprising a gate contact 70, which ohmically contacts a silicon carbide gate region 71 of second conductivity type. Preferably, the gate region 71 is doped to a concentration of $1 \times 10^{19}$ cm$^{-3}$ with a second conductivity type dopant such as Aluminum. Accordingly, as shown by unit cell 42', rectifying-gate transistor means 46' includes a silicon carbide junction field effect transistor (JFET). It will be appreciated by those skilled in the art that the switching device 10' of FIG. 5A may be preferred over the switching device 10' of FIG. 5B, in part, because the forward voltage drop across the Schottky barrier rectifier of FIG. 6 (approximately 1 volt) will typically be significantly lower that the forward voltage drop across the silicon carbide P-N junction of FIG. 7 (approximately 2.5 volts), which is formed by regions 71 and 56. In addition, the Schottky flyback diode of FIG. 6 will typically have superior turn-on and turn-off switching behavior vis-a-vis the P-N junction diode of FIG. 7, because no minority carrier injection occurs in a Schottky rectifier.

Figure 8:
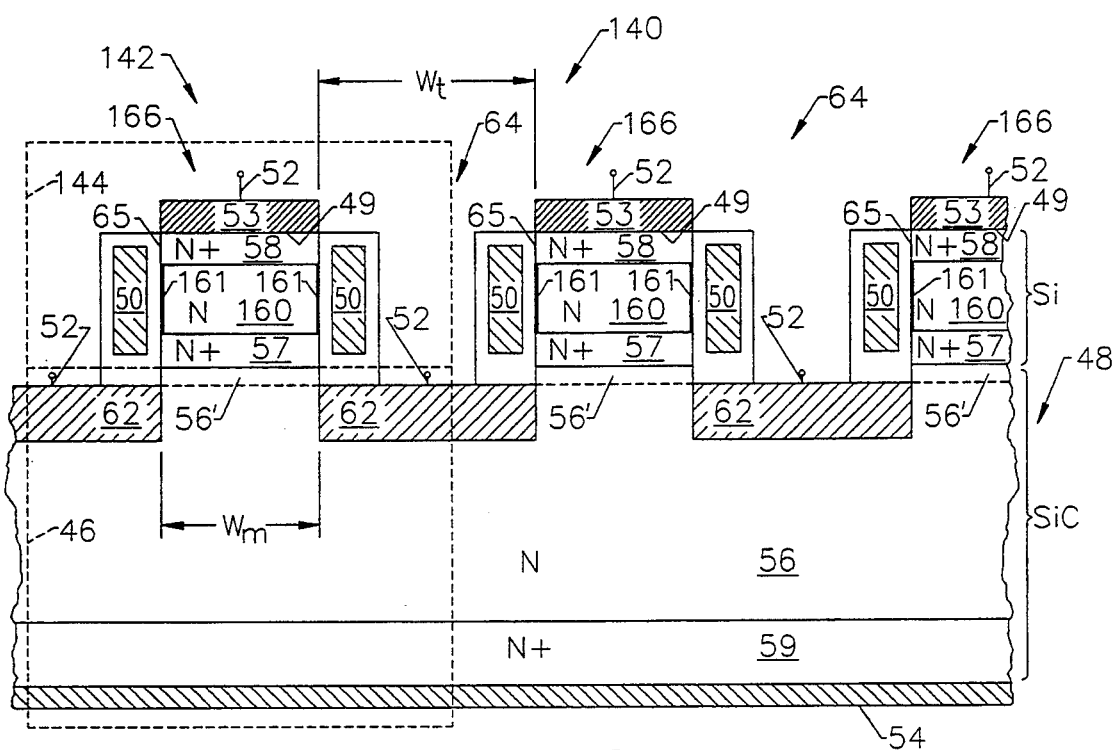
FIG. 8, illustrates a cross-sectional representation of a silicon carbide switching device in a semiconductor substrate, according to a third embodiment of the present invention.
Figure 9:
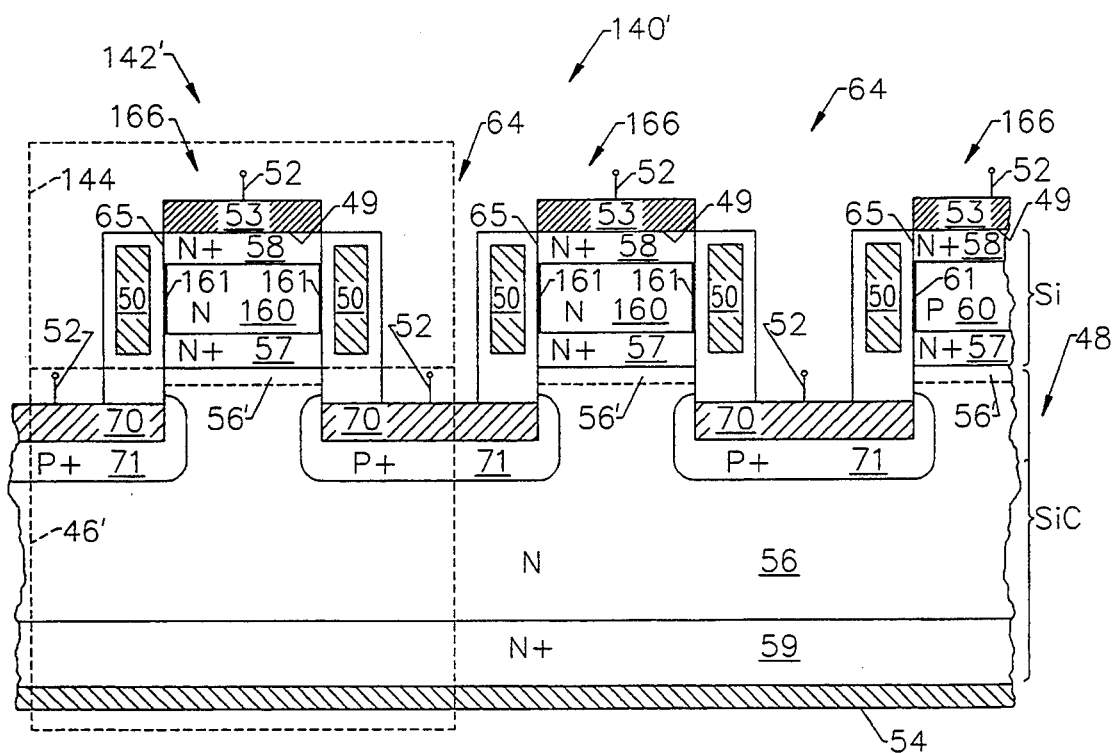
FIG. 9 illustrates a cross-sectional representation of a silicon carbide switching device in a semiconductor substrate, according to a fourth embodiment of the present invention.

Referring now to FIGS. 8 and 9, additional embodiments of the present invention will be described. In particular, the third and fourth embodiments of FIGS. 8 and 9 are similar to the embodiments of FIGS. 6 and 7, respectively, except that the P-type active region 60 is replaced with an N-type active region 160, which can support an accumulation layer channel 161 in response to a positive gate bias. Accordingly, both the unit cells 142 and 142' of switching devices 140 and 140' have insulated-gate transistor means 144, respectively, which comprise accumulation-mode FETs ("ACCU-FETs"). As will be understood by those skilled in the art, these ACCU-FETs can be made normally-off devices by properly designing the width $W_m$ of the mesas 166 so that the difference in work function potentials between the opposing gate electrodes 50 ($\psi_{gate}$) and active region 160 ($\psi_{active}$) causes a complete depletion of the mesa 166, even with zero potential bias being applied to the gate electrodes 50. Accordingly, the application of a negative bias to the gate electrodes is not required to prevent conduction between the source region 58 and the drain region 57. The difference in work function potential between the gate electrode 50 and adjacent active region 160 (i.e., $\psi_{ga}$) can be computed using the following equation:

$$\psi_{ga} \equiv \psi_{gate} - \left( \chi + \frac{E_g}{2q} - \psi_B \right) \tag{1}$$

where: $\chi$ is the electron affinity, $E_g$ is the bandgap, and $\psi_B$ is the potential difference between the Fermi level and intrinsic Fermi level, for silicon in the active region 160. $\psi_B$ is a function of the N-type doping concentration in the active region 160.

As will be understood by those skilled in the art, the greater the width of the mesa 166, the greater the work function difference must be to fully deplete the mesa region 66 and provide blocking at zero gate bias. Moreover, the application of a negative gate bias will improve the device's blocking voltage capability by extending the depletion region into the silicon carbide drift region 56. This technique for adjusting the work function difference to achieve normally-off behavior at zero gate bias is fully described in a copending and commonly assigned application entitled *Silicon Carbide Field Effect Device*, by inventor B.J. Baliga, Ser. No. 08/127,309, filed Sep. 27, 1993, the disclosure of which is hereby incorporated herein by reference.

Figure 10:
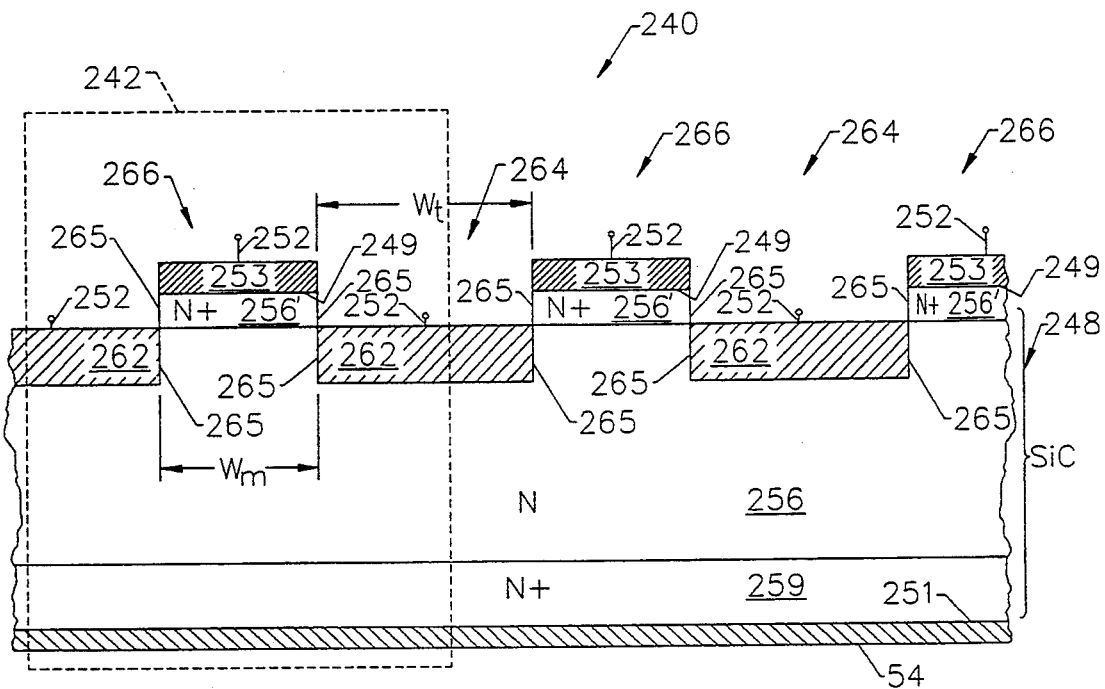
FIG. 10 illustrates a cross-sectional representation of a silicon carbide switching device in a semiconductor substrate, according to a fifth embodiment of the present invention.
Figure 11:
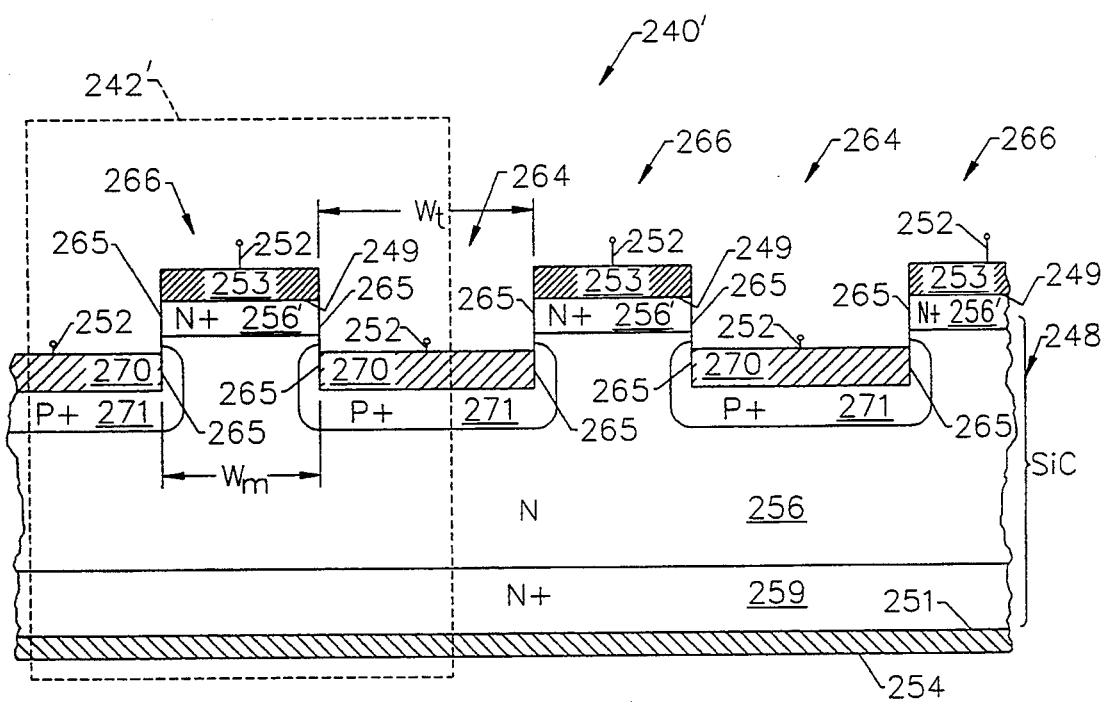
FIG. 11 illustrates a cross-sectional representation of a silicon carbide switching device in a semiconductor substrate, according to a sixth embodiment of the present invention.

Referring now to FIGS. 10 and 11, a cross-sectional illustration of a switching device 240 and 240' according to a fifth and sixth embodiment of the present invention, respectively, will be described. In particular, the embodiments of FIGS. 10 and 11 are similar to the embodiments of FIGS. 6 and 7, respectively, however, no insulated-gate transistor means 44 is present. Instead, the silicon carbide source region 256' is ohmically connected to a source contact 253 at a first face 249. Both embodiments contain a trench gate region with an optimally doped drift region 256. The forward blocking capability is achieved by the formation of a potential barrier between the source and drain regions 256' and 259, respectively. A large drain voltage can be supported by these embodiments because the drift region 256 below the trenches 264 become depleted of mobile charge carriers and supports most of the drain bias.

Referring specifically to FIG. 10, the switching device 240 comprises a silicon carbide substrate 248 having first and second opposing faces 249 and 251, respectively. As shown, a plurality of adjacent unit cells 242 are provided in the substrate 248 of first conductivity type. Each of these unit cells comprises a source region 256' of first conductivity type extending to the first face 249. A drain region 259 of first conductivity type is also provided extending to the second face 251. A drift region 256 of first conductivity type is also provided in the substrate 248, between the source region 256' and the drain region 259. As shown, the doping concentration in the drift region 256 is less than that of the source region 256' and the drain region 259. The drain region 259 is ohmically connected to the drain contact 254 at a second face of the substrate 248.

Adjacent trenches 264 are also provided in the first face 249 to thereby define a plurality of mesas 266 having sidewalls 265 extending between the drift region 256 and the source region 256'. A Schottky barrier rectifier formed by a metal region 262 adjacent the drift region 256 is also provided in the substrate 248.

As will be understood by those skilled in the art, the switching device 240 can also be made normally-off by properly designing the width $W_m$ of the mesas 266 so that the difference in work function potentials between the opposing metal regions 262 ($\psi_{metal}$) and drift region 256 ($\psi_{drift}$) causes a complete depletion of the mesas 266, even when the metal regions 262 are electrically shorted to the source electrode 252 and source contact 253. Turn-on of the device can occur by application of a positive gate bias to metal region 262 to thereby eliminate the depletion region in the adjacent mesas 266 (i.e., channels) and allow majority carrier conduction between the drain region 259 and source region 256' upon the application of an appropriate drain bias.

Referring now to FIG. 11, the Schottky barrier rectifier of FIG. 10 is replaced by a P-N junction comprising regions 271 and 256, respectively, as shown. A metal contact 270 is provided in ohmic contact with P+ region 271. As described with respect to FIG. 10, the device 240' having unit cell 242' can also be made normally-off to thereby block majority carrier conduction in the mesas 266. Normally-off behavior can be obtained by adjusting the dimensions doping concentration of the P+ region 271 in the mesas 266 and the width $W_m$ of the mesas. Turn-on of the device 240' can also occur by the application of a positive gate bias contact 270 to thereby eliminate the depletion region in the mesas 266 and provide a conductive channel between the drain region 259 and source region 256' upon the application of an appropriate drain bias.

The trenches 264 can be formed in the silicon carbide substrate 248 by first amorphizing those portions of the substrate where the trenches are to be formed and then removing the amorphized portions to expose the trenches 264. The steps for amorphizing silicon carbide preferably include the steps of forming a mask on the face 249 of a monocrystalline silicon carbide substrate 248 and exposing an area on the face corresponding to those portions of the substrate where the trenches are to be formed. Thereafter, ions are directed to the face such that the ions implant into the substrate through the exposed areas and convert the exposed regions of the substrate into amorphous silicon carbide regions. The amorphous silicon carbide regions can then be removed by etching the substrate using such etchants as $HF_2$ or $HF+HNO_3$. The above-described steps for forming trenches in monocrystalline silicon carbide are described in a co-pending, commonly-assigned application entitled, "*Method for Forming Trenches in Monocrystalline Silicon Carbide,*" Ser. No. 08/008,719, filed Jan. 25, 1993, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A three terminal gate controlled semiconductor switching device, comprising:
   a semiconductor substrate having first and second opposing faces;
   an insulated-gate field effect transistor having an insulated gate electrode, a first source region at the first face and a first drain region in the semiconductor substrate;
   a rectifying-gate field effect transistor having a gate electrode, a second source region in the semiconductor substrate and a second drain region at the second face, wherein said gate electrode and said second source region are electrically connected to said first source region and said first drain region, respectively;
   a drain contact electrically connected to said second drain region at the second face; and
   a source contact electrically connected to said first source region at the first face.

2. The three terminal gate controlled switching device of claim 1, wherein said rectifying-gate field effect transistor comprises a JFET.

3. A three terminal gate controlled semiconductor switching device, comprising:
   an insulated-gate field effect transistor having an insulated gate electrode, a first source region and a first drain region;
   a rectifying-gate field effect transistor having a gate electrode, a second source region and a second drain region, wherein said gate electrode and said second source region are electrically connected to said first source region and said first drain region, respectively;
   a drain contact electrically connected to said second drain region;
   a source contact electrically connected to said first source region; and
   wherein said rectifying-gate field effect transistor comprises a MESFET.

4. A three terminal gate controlled semiconductor switching device, comprising:
   an insulated-gate field effect transistor having an insulated gate electrode, a first source region and a first drain region;
   a rectifying-gate field effect transistor having a gate electrode, a second source region and a second drain region, wherein said gate electrode and said second source region are electrically connected to said first source region and said first drain region, respectively, wherein said first source region and said first drain region comprise silicon and wherein said second source region and said second drain region comprise silicon carbide;
   a drain contact electrically connected to said second drain region; and
   a source contact electrically connected to said first source region.

5. The three terminal gate controlled switching device of claim 4, wherein said insulated-gate field effect transistor comprises a MOSFET and said rectifying-gate field effect transistor comprises a JFET.

6. The three terminal gate controlled switching device of claim 4, wherein said insulated-gate field effect transistor comprises a MOSFET and said rectifying-gate field effect transistor comprises a MESFET.

7. A semiconductor switching device comprising:
a semiconductor substrate having first and second opposing faces;
a drift region of first conductivity type in said semiconductor substrate;
a source region of said first. conductivity type in said semiconductor substrate, extending to the first face;
a drain region of said first conductivity type in said semiconductor substrate, between said drift region and the second face, said drain region having a first conductivity type dopant concentration greater than said drift region;
insulated-gate transistor means having an active region in said substrate, between said source region at the first face and said drift region, for electrically connecting said source region to said drift region in response to a turn-on bias signal; and
rectifying-gate transistor means in said substrate, including a rectifying-gate adjacent said drift region, for controlling the conductivity of said drift region, said rectifying-gate electrically connected to said source region.

8. A semiconductor switching device, comprising:
a semiconductor substrate;
a drift region of first conductivity type in said semiconductor substrate;
a source region of said first conductivity type in said semiconductor substrate, extending to a face thereof;
insulated-gate transistor means having an active region in said substrate, between said source region and said drift region, for electrically connecting said source region to said drift region in response to a turn-on bias signal;
rectifying-gate transistor means in said substrate, including a rectifying-gate adjacent said drift region, for controlling the conductivity of said drift region, said rectifying-gate electrically connected to said source region; and
a trench in said semiconductor substrate at said face, said trench having a sidewall extending between said source region and said drift region and a bottom adjacent said drift region,
wherein said insulated-gate transistor means includes an insulated-gate electrode which extends adjacent said sidewall and wherein said rectifying-gate extends adjacent said sidewall, between said insulated-gate electrode and said trench bottom.

9. A semiconductor switching device, comprising:
a semiconductor substrate;
a drift region of first conductivity type in said semiconductor substrate;
a source region of said first conductivity type in said semiconductor substrate, extending to a face thereof;
insulated-gate transistor means having an active region in said substrate, between said source region and said drift region, for electrically connecting said source region to said drift region in response to a turn-on bias signal;
rectifying-gate transistor means in said substrate, including a rectifying-gate adjacent said drift region, for controlling the conductivity of said drift region, said rectifying-gate electrically connected to said source region; and
wherein said insulated-gate transistor means comprises an N-channel enhancement-mode silicon MOSFET and wherein said rectifying-gate transistor means comprises a field effect transistor selected from the group consisting of silicon carbide MESFETs and silicon carbide JFETs.

10. The switching device of claim 8, wherein said active region is of second conductivity type and wherein said insulated-gate transistor means forms a first conductivity type channel region in said active region in response to said turn-on bias signal.

11. The switching device of claim 10, wherein said insulated-gate transistor means further comprises an intermediate drain region of first conductivity type in said semiconductor substrate, between said active region and said drift region, said intermediate drain region having a first conductivity type dopant concentration greater than the first conductivity type dopant concentration of said drift region.

12. The switching device of claim 10, wherein said insulated-gate transistor means comprises an N-channel enhancement-mode MOSFET and wherein said rectifying-gate forms a Schottky barrier rectifier with said drift region.

13. The switching device of claim 10, wherein said insulated-gate transistor means comprises an N-channel enhancement-mode MOSFET and wherein said rectifying-gate comprises a gate region of second conductivity type in said drift region, adjacent said trench sidewall, and a conductive gate electrode ohmically contacting said gate region.

14. The switching device of claim 10, wherein said drift region comprises silicon carbide and wherein said active region comprises monocrystalline silicon.

15. The switching device of claim 10, wherein said rectifying-gate extends adjacent said trench bottom and forms a Schottky barrier rectifier with said drift region, adjacent said trench bottom.

16. The switching device of claim 11, wherein said rectifying-gate extends adjacent said sidewall, between said intermediate drain region and said trench bottom.

17. A semiconductor switching device comprising:
a semiconductor substrate having first and second opposing faces;
a source contact on said first face;
a drain contact on said second face;
a field effect transistor in said semiconductor substrate having a first source region in said substrate, a gate electrically connected to said source contact and a first drain region electrically connected to said drain contact; and
an insulated-gate field effect transistor having an insulated-gate electrode, a second source region electrically connected to said source contact and a second drain region electrically connected to said first source region, said insulated-gate field effect transistor being responsive to the application of a turn-on bias signal to said insulated-gate electrode for electrically connecting said second source region to said first source region and allowing majority carrier conduction therebetween when said drain contact is biased to a first polarity with respect to said source contact.

18. The switching device of claim 17, wherein said insulated-gate field effect transistor comprises a MOS- FET and wherein said field effect transistor comprises a MESFET.

19. The switching device of claim 17, wherein said insulated-gate field effect transistor includes a silicon active region and wherein said first drain region comprises silicon carbide.

20. The switching device of claim 17, wherein said field effect transistor provides majority carrier conduction in said first drain region when said drain contact is biased to a second polarity with respect to said source contact, opposite said first polarity, irrespective of the value of said turn-on bias signal.

21. The switching device of claim 20, wherein said insulated-gate field effect transistor comprises a MOSFET and wherein said field effect transistor comprises a JFET.

22. A silicon carbide switching device, comprising:
   a silicon carbide substrate having first and second opposing faces;
   a source region of first conductivity type in said substrate, extending to said first face;
   a drain region of first conductivity type in said substrate, extending to said second face;
   a drift region of first conductivity type in said substrate, extending between said source region and said drain region, said drift region having a first conductivity type doping concentration below the doping concentration of said source region and said drain region;
   first and second adjacent trenches in said substrate extending to said first face and defining a mesa including said source region therebetween, said mesa having first and second sidewalls extending between said drift region and said source region and said first trench having a bottom; and
   a conductive layer at the bottom, electrically connected to said source region.

23. The silicon carbide switching device of claim 22, wherein said conductive layer forms a Schottky barrier rectifying junction with said drift region.

24. The silicon carbide switching device of claim 22, further comprising a region of second conductivity type in said mesa and wherein said conductive layer ohmically contacts said region of second conductivity type.

25. A three terminal semiconductor switching device, comprising:
   a semiconductor substrate;
   a silicon carbide field effect transistor in said substrate selected from the group consisting of silicon carbide JFETs and silicon carbide MESFETs, said silicon carbide field effect transistor having a first drain region, a first source region and a first gate;
   a silicon insulated-gate field effect transistor in said substrate having a second drain region electrically connected to said first source region, a second source and a second gate;
   drain contact electrically connected to said first drain; and
   a source contact electrically connected to said first gate and said second source,
   wherein the application of a turn-on bias signal to said second gate electrically connects said source contact to said drain contact when said first drain is biased to a first polarity with respect to said second source.

26. The three terminal semiconductor switching device of claim 25, wherein said silicon insulated-gate field effect transistor comprises an enhancement-mode MOSFET.

27. The three terminal semiconductor switching device of claim 25 wherein said silicon insulated-gate field effect transistor comprises an accumulation-mode MOSFET.

28. The three terminal semiconductor switching device of claim 26, further comprising a plurality of trenches in said substrate, extending to a face thereof, and wherein said second gate extends in adjacent ones of said trenches.

* * * * *

UNITED STATES PATENT AND TRADEMARK OFFICE
CERTIFICATE OF CORRECTION

PATENT NO. : 5,396,085
DATED : March 7, 1995
INVENTOR(S) : Bantval J. Baliga

It is certified that error appears in the above-indentified patent and that said Letters Patent is hereby corrected as shown below:

On the title page, item [54] and Col. 1, line 1 and 2, title of the invention; should read:

"Three-Terminal Gate-Controlled Semiconductor Switching Device with Rectifying Gate".

Column 7, line 39, after "region" insert --60--.
Column 9, line 52, "10'" should be --10--.

Column 13, line 10, after "first" delete ".".

Signed and Sealed this

Twenty-fourth Day of September, 1996

Attest:

BRUCE LEHMAN

Attesting Officer        Commissioner of Patents and Trademarks